(12) United States Patent
Takebe

(10) Patent No.: US 6,641,961 B2
(45) Date of Patent: Nov. 4, 2003

(54) COLORED PHOTOSENSITIVE COMPOSITION AND METHOD FOR PRODUCING A COLOR FILTER

(75) Inventor: Kazuo Takebe, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/993,617

(22) Filed: Nov. 27, 2001

(65) Prior Publication Data

US 2002/0094485 A1 Jul. 18, 2002

(30) Foreign Application Priority Data

Nov. 29, 2000 (JP) ........................................ 2000-362826

(51) Int. Cl.$^7$ ............................. G02B 5/20; G03F 7/004
(52) U.S. Cl. ........................................ 430/7; 430/270.1
(58) Field of Search ................................... 430/7, 270.1

(56) References Cited

U.S. PATENT DOCUMENTS

| 5,792,589 A | 8/1998 | Udagawa et al. |
| 5,866,298 A | * 2/1999 | Iwamoto et al. ......... 430/281.1 |

FOREIGN PATENT DOCUMENTS

| JP | A 8-123016 | 5/1996 |
| JP | A 9-208611 | 8/1997 |

* cited by examiner

*Primary Examiner*—John A. McPherson
(74) *Attorney, Agent, or Firm*—Birch, Stewart, Kolasch & Birch, LLP

(57) ABSTRACT

A colored photosensitive composition used for producing a color filter which comprises a colorant (A), a binder polymer (B), a photo-polymerizable compound (C), a photo-polymerization initiator (D) and a chain transfer agent (E) is provided, and using the colored photosensitive composition, color pixels or black matrices having a rectangular or forward-tapered cross section can be formed even when the colored photosensitive composition contains the colorant in a high concentration.

11 Claims, 2 Drawing Sheets

(a)

(b)

(c)

(a)

(b)

(c)

COLORED PHOTOSENSITIVE COMPOSITION AND METHOD FOR PRODUCING A COLOR FILTER

BACKGROUND OF THE INVENTION

1. Field of the Invention

The present invention relates to a colored photosensitive composition.

2. Description of Related Art

Colored photosensitive compositions, which are photosensitive compositions colored with a colorant, are useful as materials for forming color pixels constituting a color filter in color liquid crystal displays, color solid camera and the like, or black matrices. Conventionally known compositions contain a colorant(A), a binder polymer (B), a photopolymerizable compound (C) and a photo-polymerization initiator (D).

For making color pixels or the like with these colored photosensitive compositions, for example, a colored photosensitive composition layer (1) is formed on a substrate (2) (see FIG. 1(a)), said layer (1) is exposed to light by irradiating a light beam (4) through a photo-mask (3) (see FIG. 1(b)) and then a development is conducted. By the development, a non-irradiated area (11), which is an area of the colored photosensitive composition layer (1) having not irradiated with the light beam (4), is removed, while an irradiated area (12), which is an area having irradiated with the light beam, is remained. Thus a color pixel or a black matrix (5) is formed (see FIG. 1(c)). The color pixel or the black matrix (5) formed in this manner is usually hardened by heat treatment after development in order to increase the mechanical strength.

It is desirable that the color pixel or the black matrix (5) has a thin thickness and is rectangular (see FIG. 2(a)) or forward-tapered (see FIG. 2(b)) in cross section. In order to form a sufficiently colored color pixel or the like (5) in spite of a thin thickness, the concentration of the colorant (A) contained in the colored photosensitive composition should be high.

Since, however, when, in a conventional colored photosensitive composition, the concentration of the colorant (A) is increased in order to form a color pixel or the like having a thin thickness, the obtained color pixel or the black matrix (5) tends to become reverse-tapered in cross section (see FIG. 2(c)).

The inventors have conducted extensive studies for developing a colored photosensitive composition that enables production of a color pixel or a black matrix having a rectangular or forward-tapered cross section even when the colorant is contained in a high concentration. As the result, they have found that the cross section of the obtained color pixel or the like could be a rectangular or forward-tapered cross section by adding a chain transfer agent (E), even when the colorant is contained in a high concentration. The present invention has been completed based on such finding.

SUMMARY OF THE INVENTION

The present invention provides a colored photosensitive composition comprising a colorant (A), a binder polymer (B), a photo-polymerizable compound (C), a photo-polymerization initiator (D) and a chain transfer agent (E).

Figure 1:
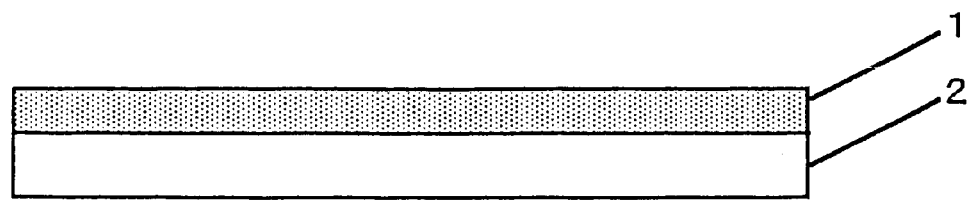
FIG. 1 is a schematic diagram showing steps for forming color pixel using a colored photosensitive composition.
Figure 1:
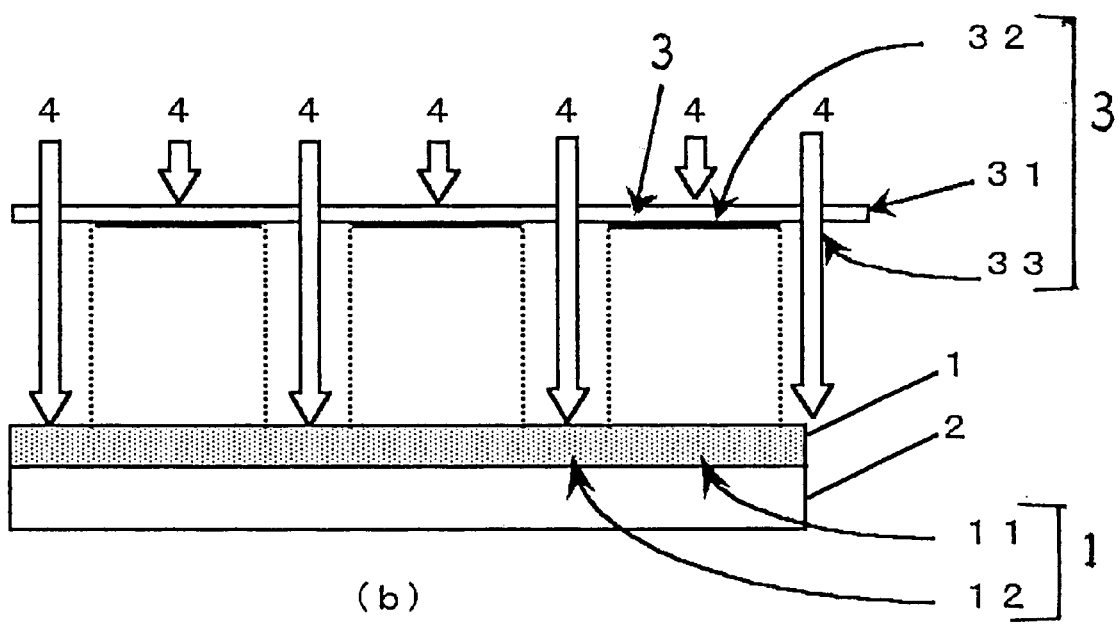
Figure 1:
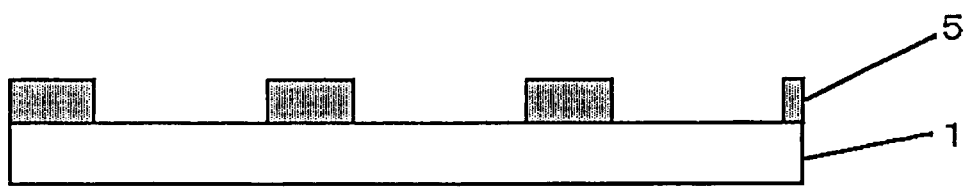

In the drawings,
1 denotes a colored photosensitive composition layer,
   11 denotes a non-irradiated area,
   12 denotes a irradiated area,
2 denotes a substrate,
3 denotes a photo-mask,
   31 denotes a glass plate,
   32 denotes a light-insulating layer,
   33 denotes a translucent area,
4 denotes a light beam,
5 denotes a color pixel or a black matrix,

DETAILED DESCRIPTION OF THE INVENTION

The colorant (A) in a colored photosensitive composition of the invention can be an organic colorant or an inorganic colorant. The organic colorant can be a pigment, a dye or a natural colorant. The inorganic colorant may be an inorganic pigment, such as metal oxides, metal complex salts and an inorganic salt of barium sulfate (Body pigment). Among the colorant, organic colorants, particularly organic pigments, are preferably used since they are excellent in heat resistance and coloring ability.

Examples of the organic pigments include compounds classified in pigments in Colour index (The Society of Dyers and Clolurists). Specific examples of the organic pigments include compounds of the following colour index (C.I.) number, although organic colorants usable in the present invention are not limited to the compouns:

C.I. Pigment yellow 1, 3, 12, 13, 14, 15, 16, 17, 20, 24, 31, 53, 83, 86, 93, 94, 109, 110, 117, 125, 128, 137, 138, 139, 147, 148, 150, 153, 154, 166 and 173;
C.I. Pigment orange 13, 31, 36, 38, 40, 42, 43, 51, 55, 59, 61, 64 65, 71 and 73;
C.I. Pigment red 9, 97, 105, 122, 123, 144, 149, 166, 168, 176, 177, 180, 192, 215, 216, 224, 242, 254, 264 and 265
C.I. Pigment blue 15, 15:3, 15:4, 15:6 and 60;
C.I. Pigment violet 1, 19, 23, 29, 32, 36 and 38;
C.I. Pigment green 7 and 36;
C.I. Pigment brown 23 and 25; and
C.I. Pigment black 1 and 7.

These organic pigments can be used singly or as a mixture of two or more of them.

The organic pigment can be, if necessary, subjected to a rosin treatment, a surface treatment using a pigment derivative having an acidic group or a basic group, or the like, a graft treatment on the pigment surface with a polymer, a fine particle treatment such as a sulfuric acid fine particle method, a washing for removing impurities with an organic solvent, water or the like.

Colorant (A) is used in an amount of usually 5–60% by mass, preferably 10–50% by mass base on the total solid contents of the colored photosensitive composition. The amount of 20% by mass or more, particularly 30% by mass or more is more preferable. Amount of organic pigment is preferably 50% by mass or more, more preferably 55% by mass or more, base or total amount of the colorant (A).

The binder polymer(B) acts as a dispersing medium for a colorant, and gives the colored photosensitive composition layer characteristics that the non-irradiated area (11) is removed by the development and the irradiated area (12) is remained. The binder polymer (B) is preferably a polymer or a co-polymer derived from a carboxyl group-containing monomer and, if desired, another monomer copolymerizable therewith.

The carboxyl group-containing monomer can be, for example, an unsaturated carboxylic acid having at least one carboxyl group in the molecule, such as an unsaturated monocarboxylic acid and unsaturated dicarboxylic acid. Specific examples thereof include acrylic acid, methacrylic acid, crotonic acid, itaconic acid, maleic acid and fumaric acid. These carboxyl group-containing monomers have carbon-carbon unsaturated bonds, and can be used each alone or in combination of two or more.

More preferably, the binder polymer (B) is a co-polymer derived from a carboxyl group-containing monomer and another monomer copolymerizable therewith. The monomer copolymerizable with such a carboxyl group-containing monomer is a compound having a polymerizable carbon-carbon unsaturated bond. Specific examples thereof include aromatic vinyl compounds such as α-methylstyrene, vinyltoluene and the like, unsaturated carboxylates such as methyl (meth)acrylate, ethyl (meth)acrylate, butyl (meth)acrylate, 2-hydroxylethyl (meth)acrylate, benzyl (meth)acrylate and the like, unsaturated aminoalkyl carboxylates such as aminoethyl acrylate and the like, unsaturated glycidyl carboxylates such as glycidyl (meth)acrylate and the like, vinyl carboxylates such as vinyl acetate and vinyl propionate and the like, vinyl cyanide compounds such as (meth)acrylonitrile and α-chloroacrylonitrile, unsaturated oxetane carboxylates such as 3-methyl-3-(meth)acryloxymethyloxetane, 3-ethyl-3-(meth)acryloxymethyloxetane, 3-methyl-3-(meth)acryloxyethyloxetane, 3-ethyl-3-(meth)acryloxyethyloxetane, and the like. These monomers can also be used each alone or in combination of two or more.

Examples of such copolymer having a carboxyl group include 3-ethyl-3-methacryloxymethyloxetane/benzyl methacrylate/methacrylic acid copolymer, 3-ethyl-3-methacryloxymethyloxetane/benzyl methacrylate/methacrylic acid/styrene copolymer, 3-ethyl-3-methacryloxymethyloxetane/methyl methacrylate/methacrylic acid copolymer, 3-ethyl-3-methacryloxymethyloxetane/methyl methacrylate/methacrylic acid/styrene copolymer and the like.

Content of the polumeriztion unit derived from a monomer having carboxyl group is preferably from 5 to 50% by mass, more preferably from 10 to 40% by mass based on the total of monomers.

The binder polymer (B) preferably have weight-average molecular weight measured by gel permeation chromatography converted to polystyrene of from 5000 to 400000, more preferably from 10000 to 300000.

The binder polymer (B) is used in an amount of usually from 5 to 90% by weight, preferably from 20 to 70% by weight based on the total amount of all solid components in the photosensitive composition.

The photo-polymerizable compound (C) is a compound that can be polymerized by the action of an active radicals or an acid generated from the photo-polymerization initiator (D) by irradiation of light beam. In general, the photo-polymerizable compound (C) has a polymerizable carbon-carbon unsaturated bond. It can be a bi-functional, or other poly-functional monomer as well as a mono-functional monomer.

Examples of the mono-functional monomer include nonylphenylcarbitol acrylate, 2-hydroxy-3-phenoxypropyl acrylate, 2-ethylhexylcarbitol acrylate, 2-hydroxyethyl acrylate, N-vinylpyrrolidone and the like.

Examples of the bi-functional monomer include 1,6-hexanediol di(meth)acrylate, ethylene glycol di(meth)acrylate, neopentyl glycol di(meth)acrylate, triethylene glycol di(meth)acrylate, bis(acryloyloxyethyl) ether of bisphenol A, 3-methylpentanediol di(meth)acrylate and the like. Examples of the other poly-functional monomer include trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate and the like.

These photopolymerizable monomers can be used each alone or in combination of two or more. It is preferred that at least one bi-functional or other poly-functional monomer is used. Amount of the photopolymerizable compound (C) is generally from 0.1 to 70 parts by mass, preferably from 1 to 60 parts by mass based on 100 parts by mass of the total amount of the binder polymer (B) and the photopolymerizable compound (C).

As the photo-polymerization initiator (D), active radical generators that generate an active radical by irradiation of light beam and acid generators that generate an acid by irradiation of light beam can be mentioned. Examples of the active radical generators include acetophenone-based polymerization initiators, benzoin-based polymerization initiators, benzophenone-based polymerization initiators, thioxanetone-based polymerization initiators triazine-based polymerization initiators and other initiators.

Specific examples of the acetophenone-based polymerization initiator include oligomers of diethoxyacetophenone, 2-hydroxy-2-methyl-1-phenylpropane-1-one, benzyldimethylketal, 2-hydroxy-2-methyl-1-[4-(2-hydroxyethoxy)phenyl]propane-1-one, 1-hydroxycyclohexylphenylketone, 2-methyl-2-morpholino-1-(4-methylthiophenyl)propane-1-one, 2-benzyl-2-dimethylamino-1-(4-morpholinophenyl)butane-1-one and 2-hydroxy-2-methyl-1-[4-(1-methylvinyl)phenyl]propane-1-one, and the like.

Specific examples of the benzoin-based polymerization initiators include benzoin, benzoin methyl ether, benzoin ethyl ether, benzoin isopropyl ether, benzoin isobutyl ether and the like. Specific examples of the benzophenone-based polymerization initiator include benzophenone, methyl o-benzoylbenzoate, 4-phenylbenzophenone, 4-benzoyl-4'-methyldiphenylsulfide, 3,3',4,4'-tetra(tert-butylperoxycarbonyl)benzophenone, 2,4,6-trimethylbenzophenone and the like.

Specific examples of the thioxanetone-based polymerization initiator include 2-isopropylthioxanetone, 4-isopropylthioxanetone, 2,4-diethylthioxanetone, 2,4-dichlorothioxanetone, 1-chloro-4-propoxythioxanetone and the like.

Specific examples of the triazine-based polymerization initiator include 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-piperonyl-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, 2,4-bis(trichloromethyl)-6-[2-(3,4-dimethoxyphenyl)ethenyl]-1,3,5-triazine and the like.

As the active radical generator, 2,4,6-trimethylbenzoyldiphenylphosphine oxide, 2,2'-bis(o-chlorophenyl)-4,4',5,5'-tetraphenyl-1,2'-biimidazole, 10-butyl-2-chloroacridone, 2-ethylanthraquinone, benzil, 9,10-phenanethrenequinone, camphorquinone, methyl phenylglyoxylate, titanocene compounds and the like can be exemplified.

Commercially available active radical generators can also be used. Examples thereof include "Irgacure-907" (an acetophenone-based polymerization initiator, manufactured by CIBA-GEIGY), and the like.

Examples of acid generators include onium salts such as 4-hydroxyphenyldimethylsulfonium p-toluenesulfonate, 4-hydroxyphenyldimethylsulfonium hexafluoroantimonate, 4-acetoxyphenyldimethylsulfonium p-toluenesulfonate, 4-acetoxyphenylmethylbenzylsulfonium hexafluoroantimonate, triphenylsulfonium p-toluenesulfonate, triphenylsulfoniumhexafluoroantimonate, diphenyliodonium p-toluenesulfonate and diphenyliodonium hexafluoroantimonate; nitrobenzyltosylates, benzointosylates, and others.

Some of active radical generators are also acid generators. For example, the triazine-based polymerization initiators mentioned above can act as acid generators as well as active radical generators.

These photopolymerization initiators can be used each alone or in combination of two or more.

The colored photosensitive composition of the invention may further comprise a photopolymerization aid. The photopolymerization aid is used, in combination with the photopolymerization initiator (D), for accelerating the polymerization of the photo-polymerizable compound (C) initiated by the photo-polymerization initiator (D). As the photopolymerization aid, for example, amine-based polymerization aids and alkoxyanthracene-based polymerization aids, and the like are exemplified.

Examples of amine-based polymerization aids include triethanolamine, methyldiethanolamine, triisopropanolamine, methyl 4-dimethylaminobenzoate, ethyl 4-dimethylaminobenzoate, isoamyl 4-dimethylaminobenzoate, 2-dimethylaminoethyl benzoate, 2-ethylhexyl 4-dimethylaminobenzoate, N,N-dimethylparatoluidine, 4,4'-bis(dimethylamino) benzophenone (commonly called Michler's ketone), 4,4'-bis(diethylamino)benzophenone, 4,4'-bis(ethylmethylamino) benzophenone and the like.

Examples of alkoxyanthracene-based polymerization aids include 9,10-dimethoxyanthracene, 2-ethyl-9,10-dimethoxyanthracene, 9,10-diethoxyanthracene, 2-ethyl-9,10-diethoxyanthracene and the like.

Commercially available photopolymerization aids can also be used. Examples thereof include "EBA-F" (manufactured by Hodogaya Chemical Co., Ltd.), and the like.

Amount of the photopolymerization aid is 10 mols or less, preferably from 0.01 to 5 mols or less based on 1 mol of the photo-polymerization initiator (D). Total amount of the photo-polymerization initiator (D) and the photopolymerization aid is generally from 3 to 30 parts by mass, preferably from 5 to 25 parts by mass based on 100 parts by mass of the total amount of the binder polymer (B) and the photopolymerizable compound (C).

The photopolymerization aids can also be used each alone or in combination of two or more.

As the chain transfer agent (E), 2,4-diphenyl-4-methyl-1-pentene, n-dodecylmercaptan, t-dodecylmercaptan, n-octylmercaptan, limonene and the like are exemplified. Although suitable amount of the chain transfer agent (E) varies depending on kinds of colorant, production conditions for color pixels and the like, usually the amount is from 0.5 to 5% by mass based on the total solid content of the colored photosensitive composition. When the amount is less than 0.5% by mass, reverse-tapered cross section may be caused depending on colorants. Preferably, the amount is 1% by mass or more. When the amount exceeds 5% by mass, sensitivity of the colored photosensitive composition may be lowered.

The colored photosensitive composition of the invention may be diluted with a solvent (F). Solvents that have been used for conventional colored photosensitive composition can be used in the invention.

Examples of the solvents include ethylene glycol monoalkyl ethers such as ethylene glycol monomethyl ether, ethylene glycol monoethyl ether, ethylene glycol monopropyl ether and ethylene glycol monobutyl ether; diethylene glycol dialkyl ethers such as diethylene glycol dimethyl ether, diethylene glycol diethyl ether, diethylene glycol dipropyl ether and diethylene glycol dibutyl ether; ethylene glycol alkyl ether acetates such as methylcellosolve acetate and ethylcellosolve acetate; alkylene glycol alkyl ether acetates such as propylene glycol monomethyl ether acetate, propylene glycol monoethyl ether acetate, propylene glycol monopropyl ether acetate, methoxybutyl acetate and methoxypentyl acetate; aromatic hydrocarbons such as benzene, toluene and xylene; ketones such as methyl ethyl ketone, acetone, methyl amyl ketone, methyl isobutyl ketone and cyclohexanone; alcohols such as ethanol, propanol, butanol, hexanol, cyclohexanol, ethylene glycol and glycerine; esters such as ethyl 3-ethoxypropionate and methyl 3-methoxypropionate; cyclic esters such as γ-butyrolactone; and the like.

These solvents can be used each alone or in combination of two or more. The amount of the solvent used is preferably from 50 to 90% by weight, more preferably from 60 to 85% by mass based on the amount of the whole colored photosensitive composition including the solvent.

The colored photosensitive composition of the invention may further comprise an additive (G), if necessary. Examples of the additives include fillers, polymer compounds other than the binder polymer (B), surfactants, adherence promoters, antioxidants, ultraviolet absorbers, coagulation preventing agents, organic acids, organic amino compounds, hardeners and the like.

Specific examples of the fillers include glass, silica, alumina and the like.

Specific examples of the polymer compounds other than the binder polymer (B) include polyvinyl alcohol, polyacrylic acid, polyethylene glycol monoalkyl ether, polyfluoroalkyl acrylate and the like.

Specific examples of the surfactants include nonionic, cationic and anionic surfactants.

Specific examples of the adherence promoters include vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexy)ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane and the like.

Specific examples of the antioxidants include 2,2-thiobis (4-methyl-6-t-butylphenol), 2,6-di-t-butylphenol and the like.

Specific examples of the ultraviolet absorbers include 2-(3-t-butyl-5-methyl-2-hydroxyphenyl)-5-chlorobenzotriazole, alkoxybenzophenone and the like.

Specific examples of the coagulation preventing agents include sodium polyacrylate.

Examples of the organic acid include aliphatic monocarboxylic acids such as formic acid, acetic acid, propionic acid, butyric acid, valeric acid, pivalic acid, caproic acid, diethylacetic acid, enanthylic acid, caprylic acid and the like;
aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, cyclohexanedicarboxylic acid, itaconic acid, citraconic acid, maleic acid, fumaric acid, mesaconic acid and the like;
aliphatic tricarboxylic acids such as tricarballylic acid, aconitic acid, camphoronic acid and the like;
aromatic monocarboxylic acids such as benzoic acid, toluic acid, cumenic acid, hemellitic acid, mesitylenic acid and the like;
aromatic dicarboxylic acids such as phthalic acid, isophthalic acid, terephthalic acid and the like;
aromatic polycarboxylic acids such as trimellitic acid, trimesic acid, mellophanic acid, pyromellitic acid and the like; and others.

Examples of organic amino compounds include mono (cyclo) alkylamines such as n-propylamine, i-propylamine, n-butylamine, i-butylamine, sec-butylamine, t-butylamine, n-pentylamine, n-hexylamine, n-heptylamine, n-octylamine, n-nonylamine, n-decylamine, n-undecylamine, n-dodecylamine, cyclohexylamine, 2-methylcyclohexylamine, 3-methylcyclohexylamine, 4-methylcyclohexylamine and the like;
di(cyclo)alkylamines such as methylethylamine, diethylamine, methyl-n-propylamine, ethyl-n-propylamine, di-n-propylamine, di-i-propylamine, di-n-butylamine, di-i-butylamine, di-sec-butylamine, di-t-butylamine, di-n-pentylamine, di-n-hexylamine, methylcyclohexylamine, ethylcyclohexylamine, dicyclohexylamine and the like;
tri(cyclo)alkylamines such as dimethylethylamine, methyldiethylamine, triethylamine, dimethyl-n-propylamine, diethyl-n-propylamine, methyldi-n-propylamine, ethyldi-n-propylamine, tri-n-propylamine, tri-i-propylamine, tri-n-butylamine, tri-i-butylamine, tri-sec-butylamine, tri-t-butylamine, tri-n-pentylamine, tri-n-hexylmine, dimethylcyclohexylamine, diethylcyclohexylamine, methyldicyclohexylamine, ethyldicyclohexylamine, tricyclohexylamine and the like;
mono(cyclo)alkanolamines such as 2-aminoethanol, 3-amino-1-propanol, 1-amino-2-propanol, 4-amino-1-butanol, 5-amino-1-pentanol, 6-amino-1-hexanol, 4-amino-1-cyclohexanol and the like;
di(cyclo)alkanolamines such as diethanolamine, di-n-propanolamine, di-i-propanolamine, di-n-butanolamine, di-i-butanolamine, di-n-pentanolamine, di-n-hexanolamine, di-(4-cyclohexanol)amine and the like;
tri(cyclo)alkanolamines such as triethanolamine, tri-n-propanolamine, tri-i-propanolamine, tri-n-butanolamine, tri-i-butanolamine, tri-n-pentanolamine, tri-n-hexanolamine, tri-(4-cyclohexanol)amine and the like;
amino(cyclo)alkanediols such as 3-amino-1,2-propanediol, 2-amino-1,3-propanediol, 4-amino-1,2-butanediol, 4-amino-1,3-butanediol, 4-amino-1,2-cyclohexanediol, 4-amino-1,3-cyclohexanediol, 3-dimethylamino-1,2-propanediol, 3-diethylamino-1,2-propanediol, 2-dimethylamino-1,3-propanediol, 2-diethylamino-1,3-propanediol and the like;
amino-group containing cycloalkanemethanols such as 1-aminocyclopentanonemethanol, 4-aminocyclopentanonemethanol, 1-aminocyclohexanonemethanol, 4-aminocyclohexanonemethanol, 4-dimethylaminocyclopentanemethanol, 4-diethylaminocyclopentanemethanol, 4-dimethylaminocyclohexanemethanol, 4-diethylaminocyclohexanemethanol and the like;
aminocarboxylic acids such as β-alanine, 2-aminobutyric acid, 3-aminobutyric acid, 4-aminobutyric acid, 2-aminoisobutyric acid, 3-aminoisobutyric acid, 2-aminovaleric acid, 5-aminovaleric acid, 6-aminocaproic acid, 1-aminocyclopropanecarboxylic acid, 1-aminocyclohexanecarboxylic acid, 4-aminocyclohexanecarboxylic acid and the like;
aromatic amines such as aniline, o-methylaniline, m-methylaniline, p-methylaniline, p-ethylaniline, p-n-propylaniline, p-i-propylaniline, p-n-butylaniline, p-t-butylaniline, 1-naphthylamine, 2-naphthylamine, N,N-dimethylaniline, N,N-diethylaniline, p-methyl-N,N-dimethylaniline and the like; aminobenzylalcohols such as o-aminobenzylalcohol, m-aminobenzylalcohol, p-aminobenzylalcohol, p-dimethylaminobenzylalcohol, p-diethylaminobenzylalcohol and the like;
aminophenols such as o-aminophenol, m-aminophenol, p-aminophenol, p-dimethylaminophenol, p-diethylaminophenol and the like;
aminobenzoic acids such as m-aminobenzoic acid, p-aminobenzoic acid, p-dimethylaminobenzoic acid, p-diethylaminobenzoic acid and the like; and others.

Hardeners are used in order to increase the mechanical strength of the color pixel by hardening it through heat treatment after development. Examples of such hardeners include compounds which can cross-link a binder polymer by a reaction with a carboxyl group in the binder polymer under heating, and they harden the color pixel or the black matrix by the cross-linkage of the binder. The hardeners may also be compounds which can polymerize themselves by heating, and they harden the color pixel or the black matrix by self-polymerization. Examples of these compounds include epoxy compounds, oxetane compounds and the like.

Examples of the epoxy compounds include epoxy resins such as bisphenol A type epoxy resins, hydrogenated bisphenol A type epoxy resins, bisphenol F type epoxy resins, hydrogenated bisphenol F type epoxy resins, novolak type epoxy resins, other aromatic epoxy resins, alicyclic epoxy resins, heterocyclic epoxy resins, glycidyl ester resins, glycidyl amine resins, epoxidized oil and the like; brominated derivatives of these epoxy resins; aliphatic, alicyclic or aromatic epoxy compounds other than the epoxy resins and their brominated derivatives; epoxidized products of butadiene (co)polymers; epoxidized products of isoprene (co) polymers; glycidyl (meth)acrylate (co)polymers; triglycidyl isocyanurate and the like.

Examples of the oxetane compounds include carbonate bisoxetane, xylylene bisoxetane, adipate bisoxetane, terephtharate bisoxetane, cyclohexane dicarboxylic acid bisoxetane and the like.

The colored photosensitive composition of the invention may contain, together with a hardener, a compound which can cause the ring-opening polymerization of an epoxy group in epoxy compounds or an oxetane nucleus in oxetane compounds. Examples of such compounds include polybasic carboxylic acids, polybasic carboxylic acid anhydrides, acid generators and the like.

Examples of the polybasic carboxylic acids include aromatic polybasic carboxylic acids such as phthalic acid, 3,4-dimethylphthalic acid, isophthalic acid, terephthalic acid, pyromellitic acid, trimellitic acid, 1,4,5,8-naphthalenetetracarboxylic acid, 3,3',4,4'-benzophenonetetracarboxylic acid and the like; aliphatic polybasic carboxylic acids such as succinic acid, glutaric acid, adipic acid, 1,2,3,4-butanetetracarboxylic acid, maleic acid, fumaric acid, itaconic acid and the like; alicyclic polybasic carboxylic acids such as hexahydrophthalic acid, 3,4-dimethyltetrahydrophthalic acid, hexahydroisophthalic acid, hexahydroterephthalic acid, 1,2,4-cyclopentanetricarboxylic acid, 1,2,4-cyclohexanetricarboxylic acid, cyclopentanetetracarboxylic acid, 1,2,4,5-cyclohexanetetracarboxylic acid and the like; and others.

Examples of polybasic carboxylic acid anhydrides include aromatic polybasic carboxylic acid anhydrides such as phthalic acid anhydride, pyromellitic acid anhydride, trimellitic acid anhydride, 3,3',4,4'-benzophenonetetracarboxylic acid dianhydride and the like; aliphatic polybasic carboxylic acid anhydrides such as itaconic acid anhydride, succinic acid anhydride, citraconic acid anhydride, dodecenylsuccinic acid anhydride, tricarballylic acid anhydride, maleic acid anhydride, 1,2,3,4-butanetetracarboxylic acid dianhydride and the like;

alicyclic polybasic carboxylic acid anhydrides such as hexahydrophthalic acid anhydride, 3,4-dimethyltetrahydrophthalic acid anhydride, 1,2,4-cyclopentanetricarboxylic acid anhydride, 1,2,4-cyclohexanetricarboxylic acid anhydride, cyclopentanetetracarboxylic acid dianhydride, 1,2,4,5-cyclohexanetetracarboxylic acid dianhydride, 1,2,3,6-tetrahydro-3,6-methanophthalic anhydride, nadic anhydride and the like;

ester-group containing carboxylic acid anhydrides such as ethylene glycol bistrimellitic acid anhydride, glycerol tristrimellitic acid anhydride and the like; and others.

Commercially available products for epoxy resin hardener may be used as the carboxylic acid anhydrides. Examples of such epoxy resin hardener include "Adeka Hardener EH-700" (trade name, available from Asahi Denka Kogyo K.K.), "Rikacid HH" (tradename, available from New Japan Chemicals Co., Ltd.), "MH-700" (trade name, available from New Japan Chemicals Co., Ltd.) and the like.

These hardeners can be used independently or in combination of two or more.

The colored photosensitive composition of the invention can be produced by mixing a colorant (A), a binder polymer (B), a photo-polymerizable compound (C), a photo-polymerization initiator (D) and a chain transfer agent (E) in a solvent (F). When it contains an additive (G), the composition can be produced by mixing a colorant (A), a binder polymer (B), a photo-polymerizable compound (C), a photo-polymerization initiator (D), a chain transfer agent (E) and an additive (G) in a solvent (F).

For making a color pixel or a black matrix (5) with the colored photosensitive composition of the invention, for example, a layer (1) of a colored photosensitive composition of the invention is formed on a substrate (2) (see FIG. 1(a)), said layer (1) is exposed to light by irradiating a light beam (4) through a photo-mask (3) (see FIG. 1(b)) and then the development is conducted.

Examples of the substrate (2) include glass plates, silicon wafers, plastic plates and the like. When a silicon wafer or the like is used as the substrate, charge-coupled devices (CCD) or the like may be formed on the surface of said silicon wafer or the like.

For forming the colored photosensitive composition layer (1) on the substrate (2), for example, the colored photosensitive composition diluted with a solvent is applied on the substrate by rotary coating method (spin-coat method), and then the solvent is evaporated.

Then, the substrate is exposed to light by irradiating a light beam (4). Usually, ultraviolet rays such as g-ray (wavelength: 436 nm), i-ray (wavelength: 365 nm) and the like are used as the light beam (4).

The light beam is irradiated through a photo-mask (3). The photo-mask herein is, for example, a glass plate (31) having, on its surface, a light-insulating layer (32) for shielding the light beam. The light beam (4) is shielded by the light-insulating layer (32). An area of the glass plate (31) having no light-insulating layer is the translucent area (33) that allows permeation of the light beam. The colored photosensitive composition layer (2) is exposed to a light according to a pattern of the translucent area (33). The intensity of the light beam to be irradiated is appropriately selected depending on kind and amount of the binder polymer (A), color and amount of the pigment (B), kind and amount of the photo-polymerizable compound (C), kind and amount of the photo-polymerization initiator (D) and others.

The development is carried out after the exposure to light. For the development, for example, the exposed colored photosensitive composition layer is immersed in a solution of a developer. Examples of the solution of a developer include aqueous solutions of an alkaline compound such as sodium carbonate, sodium hydroxide, potassium hydroxide, potassium carbonate, tetramethylammonium hydroxide and the like.

By development, a non-irradiated area (11), which is an area of the colored photosensitive composition layer having not irradiated with the light beam, is removed, while an irradiated area (12), which is an area having irradiated with the light beam, is remained and constitutes a color pixel or the black matrix (5).

Usually, by washing the product with water and drying after development, the desired color pixel or the black matrix (5) can be obtained.

Heat treatment may be applied after drying. By this heat treatment, the formed color pixel or the like is hardened resulting in increase in the mechanical strength. Use of a colored photosensitive composition containing a hardener is preferred because the mechanical strength of the color pixel or the black matrix is improved further by the heat treatment. The temperature for heat treatment is usually 180° C. or above and preferably about 200° C. or above and 250° C. or under.

Figure 2:
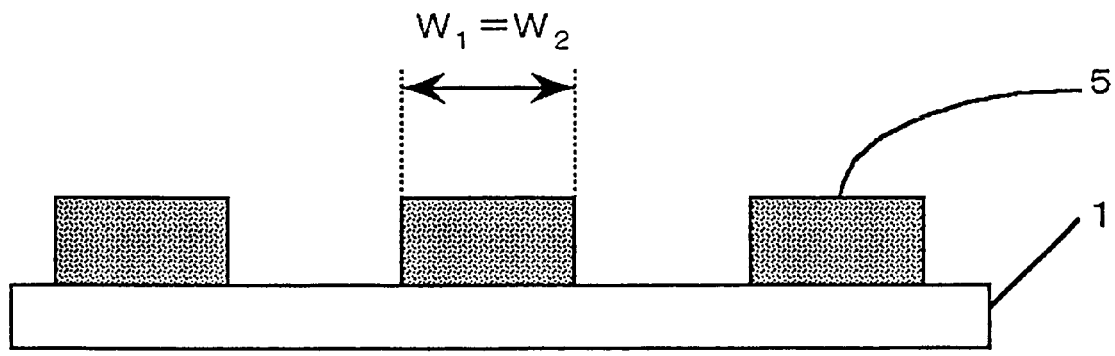
FIG. 2 is a schematic diagram showing shapes of the formed color pixels in cross section.
Figure 2:
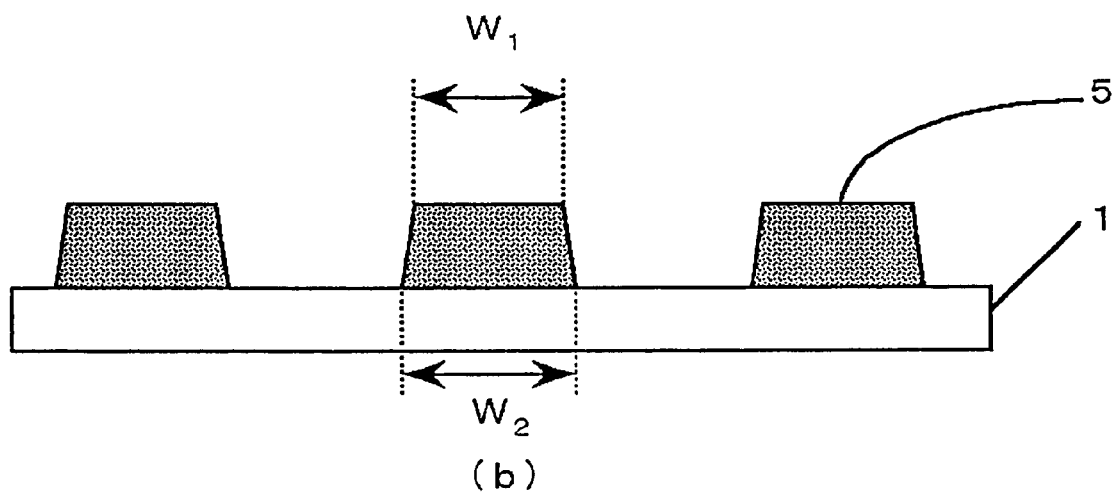
Figure 2:
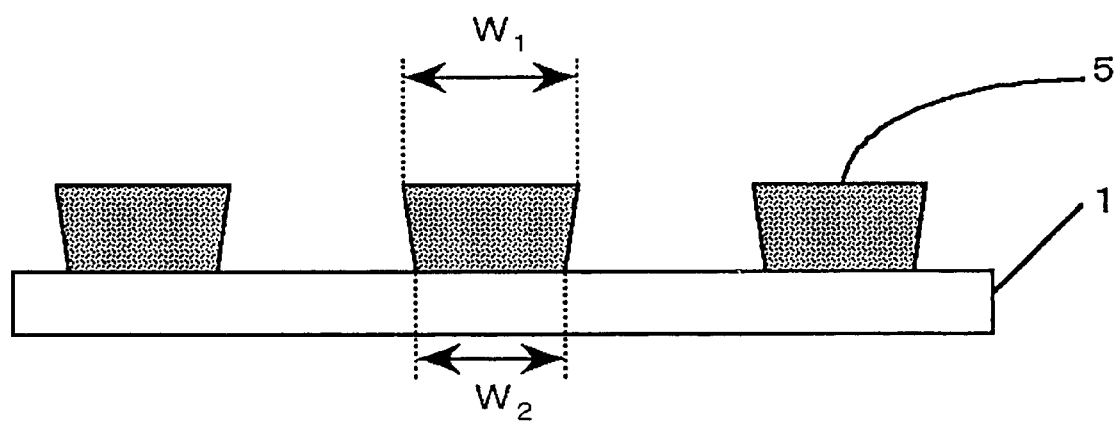

The color pixel or the black matrix (5) obtained in this manner has a thickness of, for example, 1 $\mu$m or more and 3 $\mu$m or less. When the thickness is 2 $\mu$m or less, or even 1.8 $\mu$m or less, scarcely any transparent conductive film, such as that of indium-tin complex oxide (ITO), formed on the color pixel is broken, because the cross section is rectangular or forward-tapered, and the width ($W_1$) of upper surface of the color pixel is equal to (see FIG. 2(a)) or smaller than (see FIG. 2(b)) the width ($W_2$) of bottom surface (i.e. substrate surface) of the color pixel.

For obtaining a color filter by forming a color pixel of another color or a black matrix, the above procedure is repeated changing the color of the colorant (A). In this manner, color pixels or black matrices of respective colors can be formed.

Using the colored photosensitive composition of the invention, color pixels or black matrices having a rectangular or forward-tapered cross section can be formed even when the colored photosensitive composition contains the colorant in a high concentration.

The invention will now be described in more detail with reference to Examples, which should not be construed as a limitation upon the scope of the invention.

EXAMPLE 1

Onto the surface of a glass substrate ("#7059", manufactured by Corning Glass Works) (2) was applied a colored photosensitive composition having a composition shown in Table 1 by a spin-coat method. A colored photosensitive composition layer (1) was formed by drying at 100° C. for 3 minutes. After cooling, i-ray (wavelength: 365 nm) was irradiated onto the colored photosensitive composition layer (1) as formed through a photo-mask (3). An ultra-high pressure mercury lamp was used as a light source for i-ray. The intensity of the radiation was 150 mJ/cm$^2$. The used photo-mask was a photo-mask for simultaneously forming linear pixels having line-width of 3 μm, 4 μm, 5 μm, 6 μm, 7 μm, 8 μm, 9 μm, 10 μm, 20 μm, 30 μm, 40 μm, 50 μm and 100 μm.

Then, development was carried out by immersing the substrate in a developer (an aqueous solution containing 0.05% potassium hydroxide and 0.2% sodium butylnaphthalenesulfonate, respectively, in mass percentage), followed by washing with purified water and heating at 230° C. for 20 minutes to give green-colored pixels (5).

The green-colored pixels (5) had a forward-tapered cross section and a thickness of 1.6 μm. The minimum value of line-width of color pixels formed with a desired shape (resolution) was 20 μm.

TABLE 1

| | | Amount (part by mass) |
|---|---|---|
| Pigment (A) | C. I. Pigment Green 36 | 4.95 |
| | C. I. Pigment Yellow 150 | 2.28 |
| Binder Polymer (B) | methacrylic acid/benzyl methacrylate copolymer (ratio: methacrylic acid unit/benzyl methacrylate unit was 0.30/0.60 in substance ratio and weight average molecular weight was 35,000) | 5.00 |
| Photo-polymerizable compound (C) | dipentaerythritol hexaacrylate ("KAYARAD DPHA", manufactured by Nippon Kayaku) | 5.00 |
| Photo-polymerization initiator (D) | "Irgacure-907" (manufactured by Ciba-Geigy) | 1.20 |
| Photopolymerization aid | "EAB-F" (manufactured by Hodogaya Chemicals) | 0.40 |
| Chain transfer agent (E) | 2,4-diphenyl-4-methyl-1-pentene | 0.60 |
| Solvent (F) | propyleneglycol monomethyl ether acetate | 80.00 |
| Additive (G) | pigment dispersant | 1.17 |

EXAMPLE 2

The procedure in Example 1 was repeated except that the binder polymer (methacrylic acid/benzyl methacrylate copolymer) was replaced by 5.00 parts by mass of 3-ethyl-3-methacryloxymethyloxetane/benzyl methacrylate/methacrylic acid copolymer (weight average molecular weight was 53,000 and ratio: 3-ethyl-3-methacryloxymethyloxetane unit/benzyl methacrylate/methacrylic acid unit was 0.10/0.50/0.30 in substance ratio) to form green-colored color pixels (5).

The green-colored pixels had a forward-tapered cross section, a thickness of 1.6 μm and a resolution of 20 μm.

EXAMPLE 3

The procedure in Example 1 was repeated except that the amount of the chain transfer agent was changed to 1.00 part by mass to form green-colored color pixels.

The green-colored pixels had a forward-tapered cross section, a thickness of 1.6 μm and a resolution of 100 μm.

Comparative Example 1

The procedure in Example 1 was repeated except that a colored photosensitive composition was prepared without the chain transfer agent to form green-colored color pixels.

The green-colored pixels had a reverse-tapered cross section, a thickness of 1.6 μm and a resolution of 7 μm.

Comparative Example 2

The procedure in Example 1 was repeated except that 0.60 part by mass of p-methoxyphenol was used in place of the chain transfer agent to form green-colored color pixels.

The green-colored pixels had a reverse-tapered cross section, a thickness of 1.6 μm and a resolution of 7 μm.

What is claimed is:

1. A colored photosensitive composition comprising a colorant (A), a binder polymer (B), a photo-polymerizable compound (C), a photo-polymerization initiator (D) and a chain transfer agent (E) that is selected from the group consisting of 2,4-diphenyl-4-methyl-1-pentene, n-dodecylmercaptan, t-dodecylmercaptan, n-octylmercaptan and limonene.

2. The colored photosensitive composition according to claim 1 wherein amount of the chain transfer agent (E) is from 0.5 to 5% by mass based on the total solid content of the colored photosensitive composition.

3. The colored photosensitive composition according to claim 2 wherein amount of the colorant (A) is 5–60% by mass base on the total solid contents of the colored photosensitive composition.

4. The colored photosensitive composition according to claim 2, wherein the binder polymer (B) is a co-polymer derived from a carboxyl group-containing monomer and another monomer copolymerizable therewith.

5. The colored photosensitive composition according to claim 1 wherein amount of the colorant (A) is 5–60% by mass base on the total solid contents of the colored photosensitive composition.

6. The colored photosensitive composition according to claim 1, which further comprises a photopolymerization aid.

7. The colored photosensitive composition according to claim 1, which further comprises a solvent (F).

8. A method for producing a color filter comprising a step wherein a layer of a colored photosensitive composition according to claim 1 is formed on a substrate, and a step wherein said formed layer is exposed to light by irradiating a light beam through a photo-mask followed by development to make a color pixel or a black matrix.

9. The method according to claim 8, wherein the color pixel or the black matrix has a thickness of 3 μm or less.

10. The colored photosensitive composition according to claim 1 wherein the amount of the chain transfer agent (E) is from 1 to 5% by mass based on the total solid content of the colored photosensitive composition.

11. The colored photosensitive composition according to claim 1 wherein the chain transfer agent (E) is selected from the group consisting of 2,4-diphenyl-4-methyl-1-pentene and limonene.

* * * * *